US010818736B2

(12) United States Patent
Liu (10) Patent No.: US 10,818,736 B2
(45) Date of Patent: *Oct. 27, 2020

(54) DISPLAY SUBSTRATE OF ELECTRONIC DEVICE AND METHOD FOR MANUFACTURING SAME

(71) Applicant: Beijing Xiaomi Mobile Software Co., Ltd., Beijing (CN)

(72) Inventor: Anyu Liu, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/653,074

(22) Filed: Oct. 15, 2019

(65) Prior Publication Data
US 2020/0043985 A1    Feb. 6, 2020

Related U.S. Application Data

(63) Continuation of application No. 15/792,926, filed on Oct. 25, 2017, now Pat. No. 10,516,005.

(30) Foreign Application Priority Data

Oct. 27, 2016   (CN) .......................... 2016 1 0957966

(51) Int. Cl.
*H01L 27/32*    (2006.01)
*H01L 51/52*    (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
CPC ............... H01L 27/323; H01L 51/5221; H01L 51/5068; H01L 51/508; H01L 51/5084;
(Continued)

(56) References Cited

U.S. PATENT DOCUMENTS

2005/0285114 A1   12/2005   Kang et al.
2008/0265788 A1   10/2008   Yamauchi et al.
(Continued)

FOREIGN PATENT DOCUMENTS

CN    1649456 A    8/2005
CN    1652651 A    8/2005
(Continued)

OTHER PUBLICATIONS

Extended European Search Report issued in European Patent Application No. 17198792.8, mailed from the European Patent Office, dated Mar. 20, 2018.
(Continued)

*Primary Examiner* — Mohammad M Hoque
(74) *Attorney, Agent, or Firm* — Finnegan, Henderson, Farabow, Garrett & Dunner, L.L.P.

(57) ABSTRACT

A display substrate of an electronic device and a method for manufacturing the display substrate are provided. The display substrate includes: a base; a thin film transistor formed on a side of the base; an organic light emitting layer, formed on a side of the thin film transistor facing away from the base; and a touch electrode layer, formed in the organic light emitting layer.

3 Claims, 7 Drawing Sheets

(51) Int. Cl.
  *G06F 3/041* (2006.01)
  *G06F 3/044* (2006.01)
  *H01L 29/786* (2006.01)
  *H01L 51/50* (2006.01)
  *H01L 51/56* (2006.01)

(52) U.S. Cl.
  CPC .......... *H01L 29/786* (2013.01); *H01L 51/508* (2013.01); *H01L 51/5068* (2013.01); *H01L 51/5084* (2013.01); *H01L 51/5203* (2013.01); *H01L 51/5221* (2013.01); *H01L 51/56* (2013.01); *H01L 27/3244* (2013.01)

(58) Field of Classification Search
  CPC ... H01L 29/786; H01L 51/56; H01L 51/5203; H01L 27/3244; G06F 3/0412; G06F 3/044
  USPC .......................................................... 257/40
  See application file for complete search history.

(56) References Cited

U.S. PATENT DOCUMENTS

| | | | |
|---|---|---|---|
| 2010/0117523 A1 | 5/2010 | Tchakarov | |
| 2013/0027325 A1 | 1/2013 | Liu | |
| 2015/0185942 A1 | 7/2015 | Kim et al. | |
| 2016/0103536 A1 | 4/2016 | Xiong et al. | |
| 2016/0133681 A1 | 5/2016 | Nam et al. | |
| 2016/0170524 A1* | 6/2016 | Kim | G06F 3/044 345/174 |
| 2016/0274693 A1 | 9/2016 | Liu | |
| 2016/0299610 A1 | 10/2016 | Yoon | |
| 2016/0363305 A1 | 12/2016 | Omata et al. | |
| 2017/0177139 A1 | 6/2017 | Yang et al. | |
| 2017/0269762 A1* | 9/2017 | Xu | G06F 3/0412 |
| 2017/0300154 A1 | 10/2017 | Ding et al. | |

FOREIGN PATENT DOCUMENTS

| | | | |
|---|---|---|---|
| CN | 101728421 A | | 6/2010 |
| CN | 101894856 A | | 11/2010 |
| CN | 102150113 A | | 8/2011 |
| CN | 102902395 A | | 1/2013 |
| CN | 103050506 A | | 4/2013 |
| CN | 103377608 A | | 10/2013 |
| CN | 105446554 A | * | 5/2014 |
| CN | 104409467 A | | 3/2015 |
| CN | 104752466 A | | 7/2015 |
| CN | 104795425 A | | 7/2015 |
| CN | 104850268 A | | 8/2015 |
| CN | 104881179 A | | 9/2015 |
| CN | 104898887 A | | 9/2015 |
| CN | 105243993 A | | 1/2016 |
| CN | 105446554 A | | 3/2016 |
| CN | 105518863 A | | 4/2016 |
| CN | 105590951 A | | 5/2016 |
| CN | 106033765 A | | 10/2016 |
| EP | 1986324 A1 | | 10/2008 |
| JP | H9-251820 A | | 9/1997 |
| JP | 2010108693 A | | 5/2010 |
| JP | 2013224977 A | | 10/2013 |
| KR | 20110022375 A | | 3/2011 |
| KR | 20110044670 A | | 4/2011 |
| KR | 20120062178 A | | 6/2012 |
| KR | 20140062341 A | | 5/2014 |
| KR | 20150020929 A | | 2/2015 |
| KR | 20160072336 A | | 6/2016 |
| WO | WO 2015/186266 A1 | | 12/2015 |
| WO | WO 2017/045133 A1 | | 3/2017 |

OTHER PUBLICATIONS

International Search Report of PCT Application No. PCT/CN2016/1109999, dated Jul. 19, 2017, issued by the ISA/CN—State Intellectual Property Office of the P.R. China.

* cited by examiner

DISPLAY SUBSTRATE OF ELECTRONIC DEVICE AND METHOD FOR MANUFACTURING SAME

CROSS-REFERENCE TO RELATED APPLICATIONS

The present application is a continuation of U.S. patent application Ser. No. 15/792,926, filed Oct. 25, 2017, which is based upon and claims priority to Chinese Patent Application 201610957966.3, filed Oct. 27, 2016, the entire contents of both of which are incorporated herein by reference.

TECHNICAL FIELD

The present disclosure generally relates to the field of terminal technology and, more particularly, to a display substrate of an electronic device and a method for manufacturing the display substrate.

BACKGROUND

With the wide usage of touch screens, various structures of touch electrodes have been developed. These structures of touch electrodes can be installed at different positions of a display device to recognize touch operations by a user. However, conventionally the touch electrodes are manufactured independently from the display devices. Such low level of integration between the touch electrodes and the display devices not only makes the manufacturing process of a touch screen complicated, but also causes the touch electrodes to occupy a large space in a display device.

SUMMARY

According to a first aspect of the present disclosure, there is provided display substrate, comprising: a base; a thin film transistor formed on a side of the base; an organic light emitting layer, formed on a side of the thin film transistor facing away from the base; and a touch electrode layer, formed in the organic light emitting layer.

According to a second aspect of the present disclosure, there is provided a method for manufacturing a display substrate, comprising: forming a thin film transistor on a base; forming an organic light emitting layer on a side of the thin film transistor facing away from the base; and after the organic light emitting layer is formed, forming a touch electrode layer in the organic light emitting layer.

According to a third aspect of the present disclosure, there is provided an electronic apparatus, comprising: a processor; a memory for storing instructions executable by the processor; and a display substrate including: a base; a thin film transistor, formed on a side of the base; an organic light emitting layer, formed on a side of the thin film transistor facing away from the base; and a touch electrode layer, formed in the organic light emitting layer.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of devices and methods consistent with aspects related to the present disclosure as recited in the appended claims.

Figure 1:
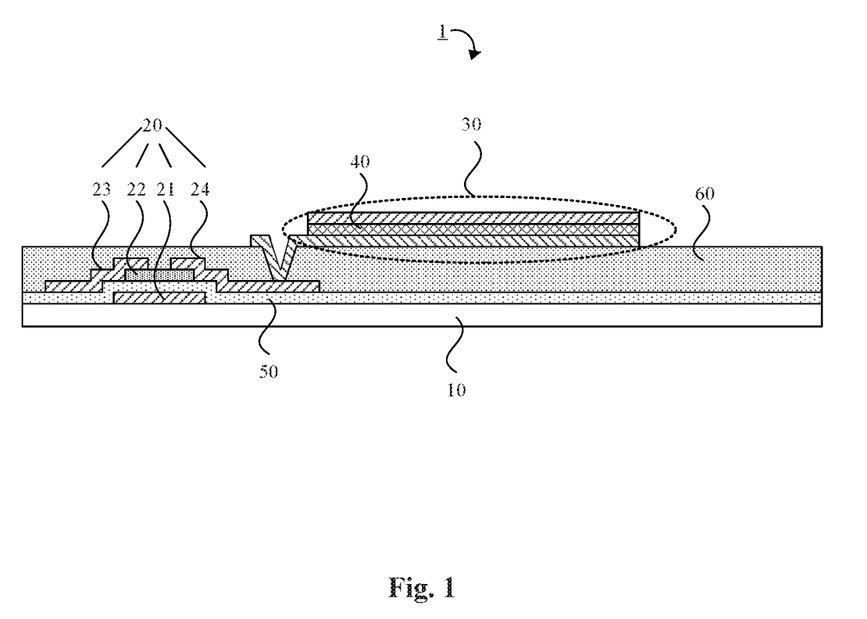
FIG. 1 is a schematic diagram illustrating a display substrate, according to an exemplary embodiment.

FIG. 1 is a schematic diagram illustrating a display substrate 1, according to an exemplary embodiment. For example, the display substrate 1 may be used in an electronic device having a display function. As shown in FIG. 1, the display substrate 1 includes: a base 10, a thin film transistor 20, an organic light emitting layer 30, and a touch electrode layer 40.

In the disclosed embodiments, the base 10 may be made of any suitable material. In one embodiment, the material of the base 10 may be glass. In another embodiment, the base 10 may be made of flexible resin, such that display substrate 1 can be used in a flexible display device.

The thin film transistor 20 is formed on a side of the base 10. As shown in FIG. 1, in some embodiments, the thin film transistor 20 may include structures such as a gate electrode 21, an active layer 22, a source electrode 23, and a drain electrode 24. In one embodiment, a gate insulating layer 50 may be provided between the gate electrode 21 and the active layer 22.

The organic light emitting layer 30 is formed on a side of the thin film transistor 20 facing away from the base 10. In one embodiment, this means that the organic light emitting layer 30 is created after the thin film transistor 20 is formed. A passivation layer 60 may be provided between the organic light emitting layer 30 and the thin film transistor 20. The organic light emitting layer 30 is electrically connected to the thin film transistor 20 through a via hole in the passivation layer 60. The thin film transistor 20 may be formed by a patterning process, and the organic light emitting layer 30 may be formed by a vapor deposition process.

It should be noted that the size relationship and/or position relationship of the organic light emitting layer 30 and the thin film transistor 20 as shown in FIG. 1 is only an example. In the disclosed embodiments, the size relationship and position relation may be adjusted as needed. For example, the area of the organic light emitting layer 30 may be increased, such that the organic light emitting layer 30 also lies above the thin film transistor 20. In addition, a pixel defining layer (not shown) may be provided between the sub-pixels constituted by the organic light emitting layer 30.

The touch electrode layer 40 is formed in the organic light emitting layer 30. For example, in one embodiment, the organic light emitting layer 30 may include a multi-layer structure, and the touching electrode layer 40 may be formed between two adjacent layers in the organic light emitting layer 30. In this embodiment, the touch electrode layer 40 may be formed by a patterning process. Moreover, electrical wiring to the touch electrode layer 40 may be formed in the display substrate 1 using any known method in the art.

By forming the touch electrode layer 40 in the organic light emitting layer 30, the integration level of the display substrate 1 is improved. Because the organic light emitting layer 30 can have a large area and/or be disposed directly above the thin film transistor 20, the touch electrode layer 40 formed in the organic light emitting layer 30 can also have a larger size. This way, the touch electrode layer 40 can sense touch signals in a larger area.

Figure 2:
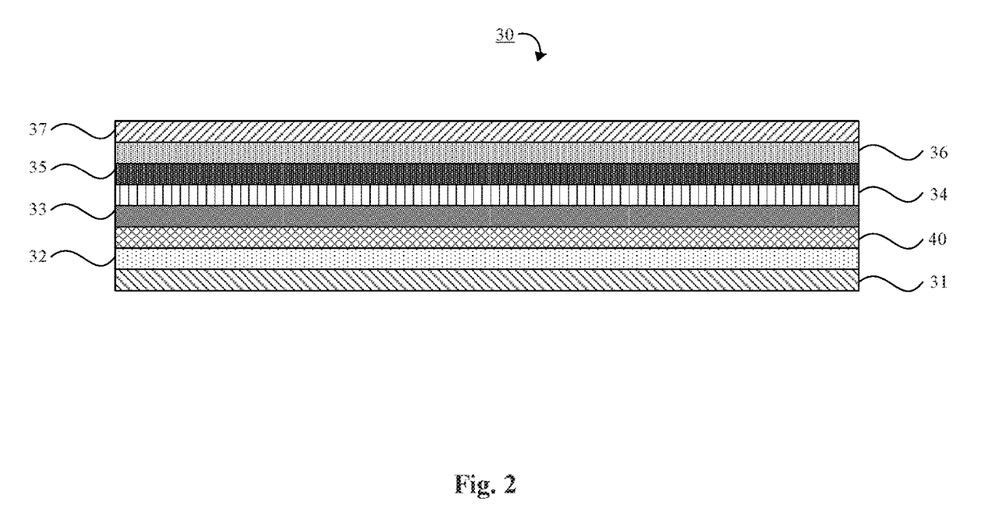
FIG. 2 is a schematic diagram illustrating an organic light emitting layer, according to an exemplary embodiment.

FIG. 2 is a schematic diagram illustrating an organic light emitting layer 30 used in the display substrate 1 of FIG. 1, according to an exemplary embodiment. As shown FIG. 2, the organic light emitting layer 30 includes: an anode layer 31, a hole injection layer 32, a hole transport layer 33, an organic material layer 34, an electron transport layer 35, an electron injection layer 36, and a cathode layer 37.

Referring to FIGS. 1 and 2 collectively, the anode layer 31 is formed on the side of the thin film transistor 20 facing away from the base 10. The hole injection layer 32 is formed on a surface of the anode layer 31 facing away from the thin film transistor 20. The hole transport layer 33 is formed on a surface of the hole injection layer 32 facing away from the anode layer 31. The organic material layer 34 is formed on a surface of the hole transport layer 33 facing away from the hole injection layer 32. The electron transport layer 35 is formed on a surface of the organic material layer 34 facing away from the hole transport layer 33. The electron injection layer 36 is formed on a surface of the electron transport layer 35 facing away from the organic material layer 34. The cathode layer 37 is formed on a surface of the electron injection layer 36 facing away from the electron transport layer 35.

In various embodiments, the touch electrode layer 40 may be formed between the anode layer 31 and the hole injection layer 32, between the hole injection layer 32 and the hole transport layer 33, between the hole transport layer 33 and the organic material layer 34, between the organic material layer 34 and the electron transport layer 35, between the electron transport layer 35 and the electron injection layer 36, and/or between the electron injection layer 36 and the cathode layer 37.

For example, as shown in FIG. 2, in one embodiment, the touch electrode layer 40 may be disposed between the hole injection layer 32 and the hole transport layer 33. Nevertheless, it is contemplated that the specific position of the touch electrode layer 40 may be set as desired, and is not limited to between the hole injection layer 32 and the hole transport layer 33. Consistent with the disclosed embodiments, a positive voltage may be applied to the anode layer 31, and a negative voltage may be applied to the cathode layer 37, thus forming a current flowing from the anode layer 31 to the cathode layer 37. Electrons from the cathode layer 37 sequentially pass through the electron injection layer 36, the electron transport layer 35, the organic material layer 34, the hole transport layer 33, the hole injection layer 32, and reach the anode layer 31. When the electrons pass through the organic material layer 34, the electrons excite the organic material in the organic material layer 34 to emit light.

In one embodiment, the organic material layers 34 in all the sub-pixels emit white light when being excited. Color filters, such as red filters, green filters, and blue filters, are provided in a substrate associated with the display substrate 1. Each color filter corresponds to a sub-pixel and filters the white light emitted from the corresponding sub-pixel. This way, different sub-pixels of a pixel can generate lights of different colors. As such, by adjusting the intensities of the lights emitted by the sub-pixels of the same pixel, the color of the pixel can be changed.

In one embodiment, the organic material layers 34 in different sub-pixels may emit lights with different colors when being excited. For example, the organic material layers 34 in three different sub-pixels may emit red light, green light, and blue light, respectively. This way, different sub-pixels of a pixel can emit lights with different colors. As such, by adjusting the intensities of lights emitted by the sub-pixels of the same pixel, the color of the pixel can be changed.

In some embodiments, if the display substrate 1 is used in a display device with a bottom emission structure, the anode layer 31 may be formed by transparent conductive material and the cathode layer 37 may be formed by conductive material with a high reflectivity, such that the light may be emitted from the bottom of the display device. However, if the display substrate 1 is used in a display device with a top emission structure, the cathode layer 37 may be formed by transparent conductive material and the anode layer 31 may be formed by conductive material with a high reflectivity, such that the light may be emitted from the top of the display device. The transparent conductive material may be indium tin oxide (ITO), and the conductive material with a higher reflectivity may be a metal, such as aluminum or silver.

Figure 3:
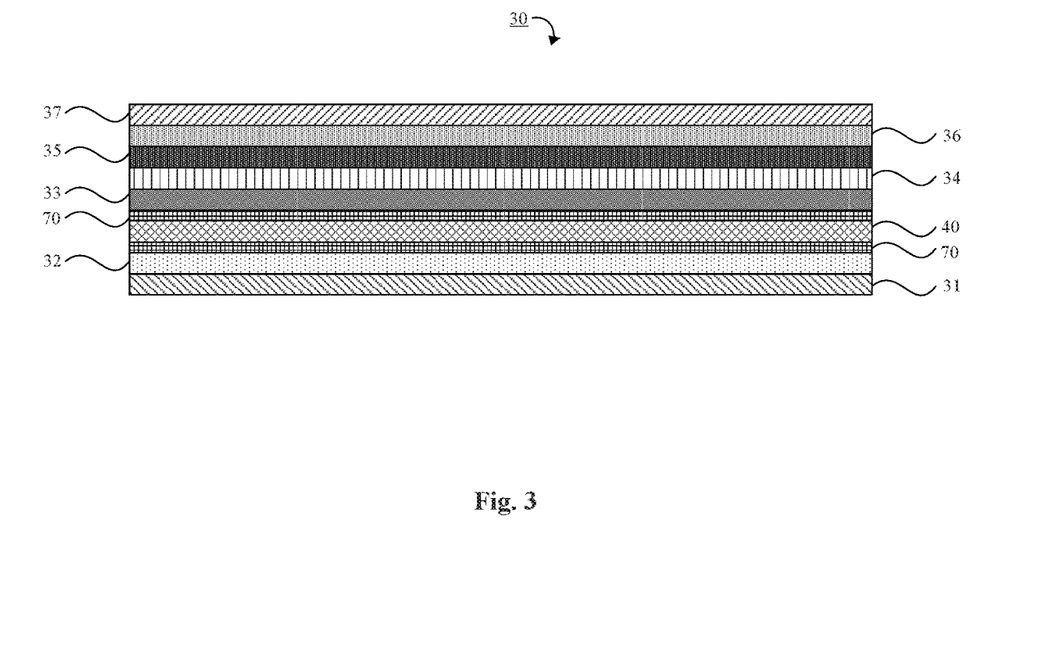
FIG. 3 is a schematic diagram illustrating an organic light emitting layer, according to an exemplary embodiment.

FIG. 3 is a schematic diagram showing an organic light emitting layer 30 used in the display substrate 1 of FIG. 1, according to another exemplary embodiment. Similar to FIG. 2, the organic light emitting layer 30 in FIG. 3 also includes: an anode layer 31, a hole injection layer 32, a hole transport layer 33, an organic material layer 34, an electron transport layer 35, an electron injection layer 36, and a cathode layer 37.

In addition, an insulating layer 70 may be formed between the touch electrode layer 40 and layers adjacent to the touch electrode layer 40. For example, as shown in FIG. 3, the insulating layer 70 may be provided between the touch electrode layer 40 and the hole injection layer 32, and/or between the touch electrode layer 40 and the hole transport layer 33. Typically, when electrons flow from the cathode layer 37 to the anode layer 31 in the organic light emitting layer 30, some of the electrons may accumulate in the layer structure adjacent to the touch electrode layer 40, thereby affecting touch signals generated by the touch electrode layer 40. By placing one or more insulating layers between the touch electrode layer 40 and its adjacent layer structure (s), the influence by the adjacent layer structure(s) on the touch electrode layer 40 may be reduced. As such, the accuracy of the touch electrode layer 40's sensing of touch operations may be improved.

In one embodiment, the touch electrode layer 40 is a self-induction capacitor. Typically, when a user touches the display device in which the display substrate 1 is used, because the cathode layer 37 is located between the user's finger(s) and the touch electrode layer 40, the cathode layer 37 may generate a shielding effect on the touch signals generated by the touch electrode layer 40. By using the self-induction-capacitor-based touch electrode layer 40, the intensity of the generated touch signals is relatively high, and thus can achieve more accurate sensing results.

Corresponding to the above embodiments of the disclosed display substrate, the present disclosure further provides embodiments of a method for manufacturing the disclosed display substrate.

Figure 4:
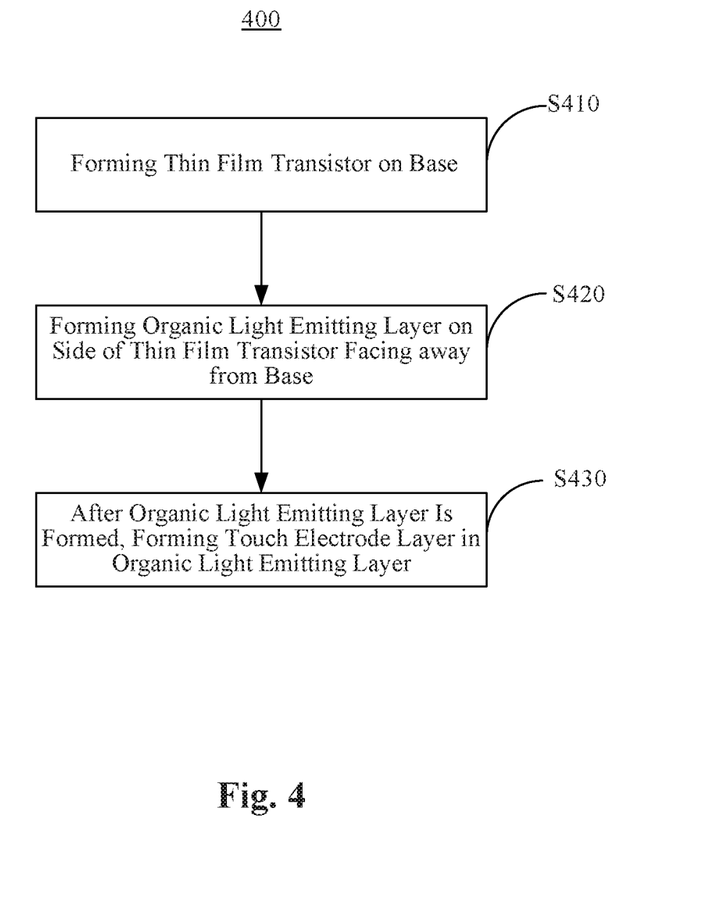
FIG. 4 is a flowchart of a method for manufacturing a display substrate, according to an exemplary embodiment.

FIG. 4 is a flowchart of a method 400 for manufacturing a display substrate, according to an exemplary embodiment. For example, the method 400 may be used to manufacture the display substrate 1 (FIG. 1). As shown in FIG. 4, the method 400 includes following steps.

At step S410, a thin film transistor is formed on a base.

At step S420, an organic light emitting layer is formed on a side of the thin film transistor facing away from the base.

At step S430, after the organic light emitting layer is formed, a touch electrode layer is formed in the organic light emitting layer.

Figure 5:
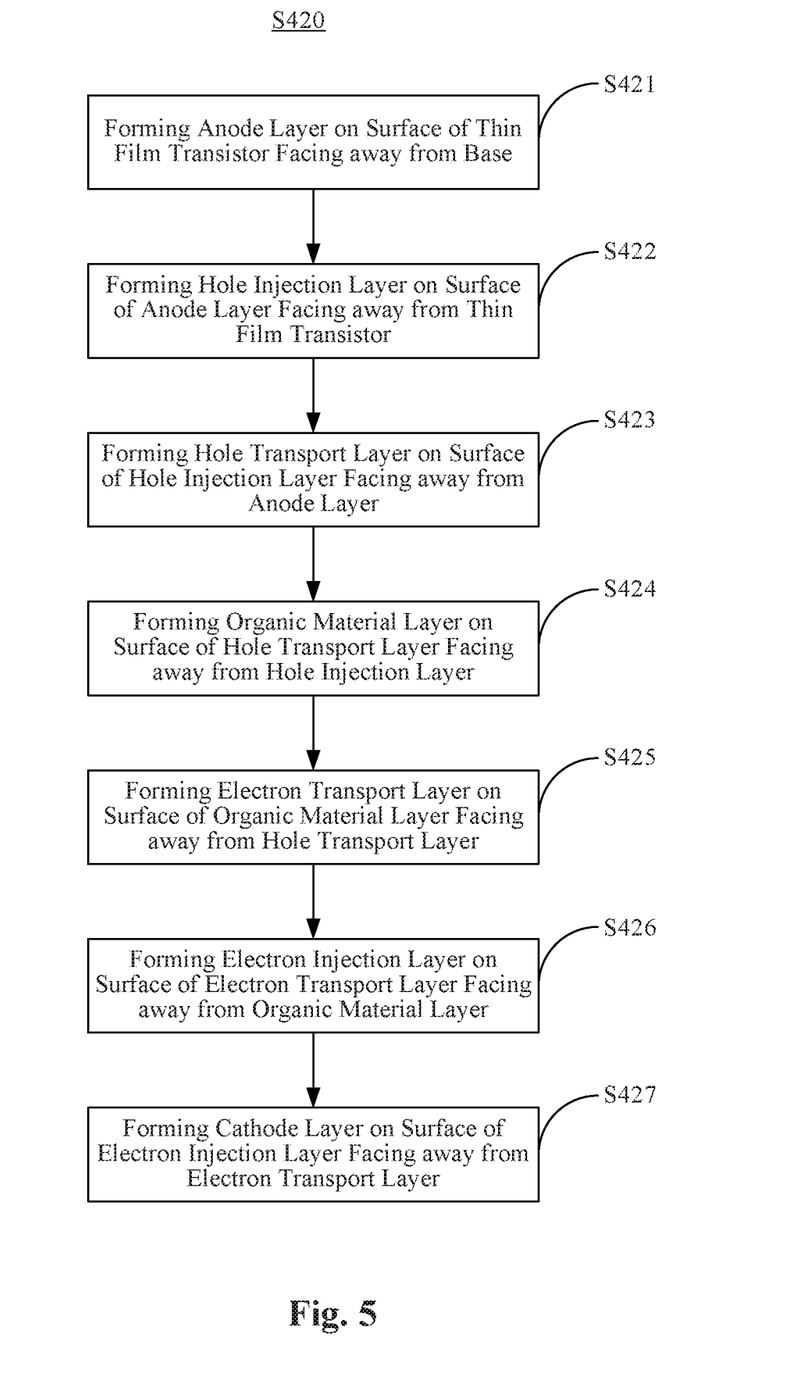
FIG. 5 is a flowchart of a step for forming an organic light emitting layer of a display substrate, according to an exemplary embodiment.

FIG. 5 is a flowchart of step 420 in the method 400, according to an exemplary embodiment. Referring to FIG. 5, step 420 may further include the following sub-steps.

At sub-step S421, an anode layer is formed on the side of the thin film transistor facing away from the base.

At sub-step S422, a hole injection layer is formed on a surface of the anode layer facing away from the thin film transistor.

At sub-step S423, a hole transport layer is formed on a surface of the hole injection layer facing away from the anode layer.

At sub-step S424, an organic material layer is formed on a surface of the hole transport layer facing away from the hole injection layer.

At sub-step S425, an electron transport layer is formed on a surface of the organic material layer facing away from the hole transport layer.

At sub-step S426, an electron injection layer is formed on a surface of the electron transport layer facing away from the organic material layer.

At sub-step S427, a cathode layer is formed on a surface of the electron injection layer facing away from the electron transport layer.

Optionally, corresponding to the above sub-steps, step 430 may further include at least one of: forming the touch electrode layer between the anode layer and the hole injection layer; forming the touch electrode layer between the hole injection layer and the hole transport layer; forming the touch electrode layer between the hole transport layer and the organic material layer; forming the touch electrode layer between the organic material layer and the electron transport layer; forming the touch electrode layer between the electron transport layer and the electron injection layer; or forming the touch electrode layer between the electron injection layer and the cathode layer.

Figure 6:
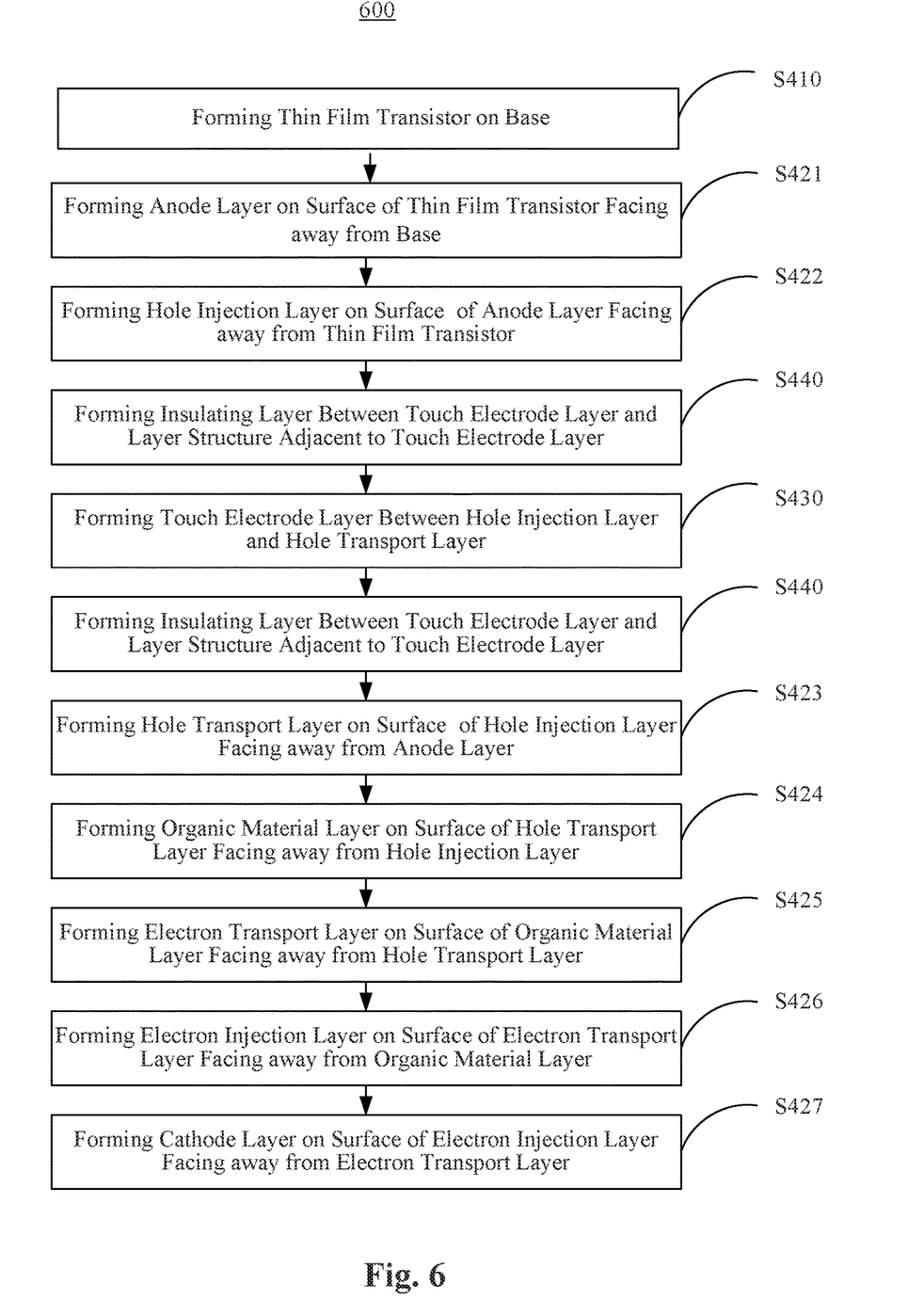
FIG. 6 is a flowchart of a method for manufacturing a display substrate, according to an exemplary embodiment.

FIG. 6 is a flowchart of a method 600 for manufacturing a display substrate, according to another exemplary embodiment. Referring to FIG. 6, in addition to steps S410-S430 shown in FIG. 4 and sub-steps S421-S427 shown in FIG. 5, the method 600 may further include one or more steps 440.

At step S440, an insulating layer is formed between the touch electrode layer and a layer structure adjacent to the touch electrode layer.

It is contemplated that the execution order of the steps and sub-steps in the method 600 may be adjusted as needed. For example, as shown in FIG. 6, step S430 may be performed between sub-step S422 and sub-step S423, and step S440 may be performed between sub-step S422 and step S430 and/or between step S430 and step S423.

In some embodiments, the touch electrode layer formed in step 430 is a self-induction capacitor.

With respect to the above-described methods for manufacturing a display substrate, the specific manners of implementing some or all of the steps and sub-steps in the methods can be further referred to the above-described embodiments of the related display substrate, which will not be repeated herein.

Figure 7:
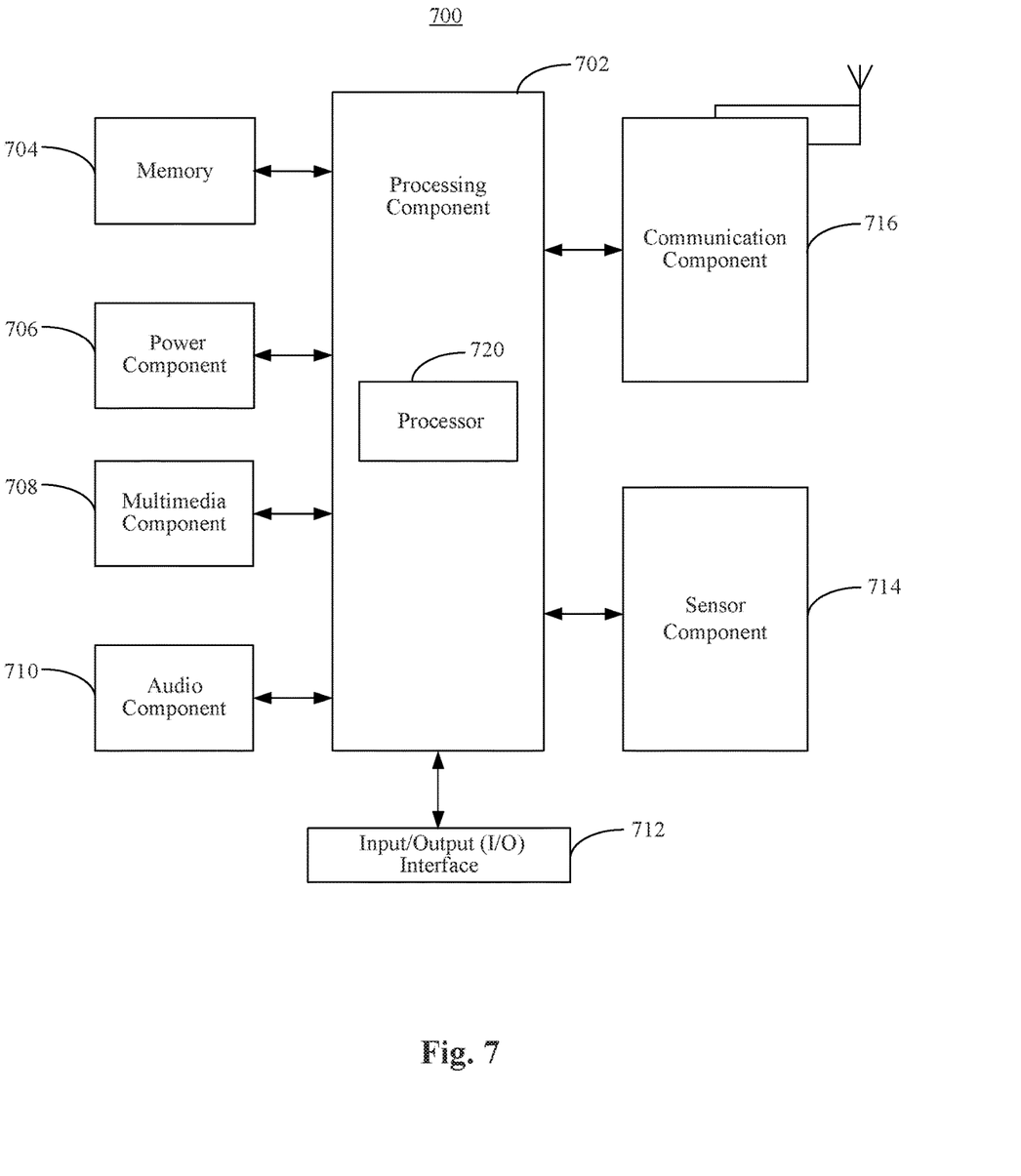
FIG. 7 is a block diagram of an electronic device, according to an exemplary embodiment.

FIG. 7 is a block diagram of an electronic device 700, according to an exemplary embodiment. For example, the electronic device 700 may be a mobile phone, a computer, a digital broadcast terminal, a messaging device, a gaming console, a tablet, a medical device, exercise equipment, a personal digital assistant, and the like. The display substrate 1 shown in FIG. 1 may be used in the electronic device 700 to form a part of a display device included in the electronic device 700.

Referring to FIG. 7, the electronic device 700 may include one or more of the following components: a processing component 702, a memory 704, a power component 706, a multimedia component 708, an audio component 710, an input/output (I/O) interface 712, a sensor component 714, and a communication component 716.

The processing component 702 typically controls overall operations of the electronic device 700, such as the operations associated with display, telephone calls, data communications, camera operations, and recording operations. The processing component 702 may include one or more processors 720 to execute instructions to perform all or some of the operations of the electronic device 700. Moreover, the processing component 702 may include one or more modules which facilitate the interaction between the processing component 702 and other components. For instance, the processing component 702 may include a multimedia module to facilitate the interaction between the multimedia component 708 and the processing component 702.

The memory 704 is configured to store various types of data to support the operation of the electronic device 700. Examples of such data include instructions for any applications or methods operated on the electronic device 700, contact data, phonebook data, messages, pictures, video, etc. The memory 704 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk, etc.

The power component 706 provides power to various components of the electronic device 700. The power component 706 may include a power management system, one or more power sources, and any other components associated with the generation, management, and distribution of power in the electronic device 700.

The multimedia component 708 includes a screen providing an output interface between the electronic device 700 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. Consistent with the disclosed embodiments, the touch panel may include the disclosed display substrate. Moreover, the display substrate may be manufactured using the manufacturing methods provided by the present disclosure. In some embodiments, the multimedia component 708 includes a front camera and/or a rear camera. The front camera and/or the rear camera may receive an external multimedia datum while the electronic device 700 is in an operation mode, such as a photographing mode or a video mode. Each of the front camera and the rear camera may be a fixed optical lens system or have focus and optical zoom capability.

The audio component 710 is configured to output and/or input audio signals. For example, the audio component 710 includes a microphone configured to receive an external audio signal when the electronic device 700 is in an operation mode, such as a call mode, a recording mode, and a voice recognition mode. The received audio signal may be further stored in the memory 704 or transmitted via the communication component 716. In some embodiments, the audio component 710 further includes a speaker to output audio signals.

The I/O interface 712 provides an interface between the processing component 702 and peripheral interface modules, such as a keyboard, a click wheel, buttons, and the like. The buttons may include, but are not limited to, a home button, a volume button, a starting button, and a locking button.

The sensor component 714 includes one or more sensors to provide status assessments of various aspects of the electronic device 700. For instance, the sensor component 714 may detect an open/closed status of the electronic device 700, relative positioning of components, e.g., the display and the keypad, of the electronic device 700, a change in position of the electronic device 700 or a component of the electronic device 700, a presence or absence of user contact with the electronic device 700, an orientation or an acceleration/deceleration of the electronic device 700, and a change in temperature of the electronic device 700. The sensor component 714 may include a proximity sensor configured to detect the presence of nearby objects without any physical contact. The sensor component 714 may further include a light sensor, such as a complementary metal oxide semiconductor (CMOS) or a charge coupled device (CCD) image sensor, for use in imaging applications. In some embodiments, the sensor component 714 may further include an accelerometer sensor, a gyroscope sensor, a magnetic sensor, a pressure sensor or a temperature sensor.

The communication component 716 is configured to facilitate communication, wired or wirelessly, between the electronic device 700 and other devices. The electronic device 700 may access a wireless network based on a communication standard, such as WiFi, 2G, 3G, 4G, 5G, LTE, or a combination thereof. In one exemplary embodiment, the communication component 716 receives a broadcast signal or broadcast associated information from an external broadcast management system via a broadcast channel. In one exemplary embodiment, the communication component 716 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth® (BT) technology, and other technologies.

In exemplary embodiments, the electronic device 700 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A display substrate, comprising:
   a base;
   a thin film transistor formed on a side of the base;
   an organic light emitting layer, formed on a side of the thin film transistor facing away from the base, the organic light emitting layer comprising:
      an anode layer, formed on the side of the thin film transistor facing away from the base;
      a hole injection layer, formed on a surface of the anode layer facing away from the thin film transistor;
      a hole transport layer, formed on a surface of the hole injection layer facing away from the anode layer;
      an organic material layer, formed on a surface of the hole transport layer facing away from the hole injection layer;
      an electron transport layer, formed on a surface of the organic material layer facing away from the hole transport layer;
      an electron injection layer, formed on a surface of the electron transport layer facing away from the organic material layer; and
      a cathode layer, formed on a surface of the electron injection layer facing away from the electron transport layer;
   a touch electrode layer, formed between two adjacent layers in the organic light emitting layer;
   a passivation layer, provided between the organic light emitting layer and the thin film transistor; and
   an insulating layer, formed between the touch electrode layer and a layer of the organic light emitting layer that is adjacent to the touch electrode layer,
   wherein the organic light emitting layer is electrically connected to the thin film transistor through at least one via defined in the passivation layer, and
   wherein the touch electrode layer is formed:
      between the anode layer and the hole injection layer, or
      between the hole transport layer and the organic material layer, or
      between the organic material layer and the electron transport layer, or between the electron injection layer and the cathode layer.

2. The display substrate of claim 1, wherein the touch electrode layer is a self-induction capacitor.

3. An electronic apparatus, comprising:
a processor;
a memory for storing instructions executable by the processor; and
a display substrate including:
   a base;
   a thin film transistor, formed on a side of the base;
   an organic light emitting layer, formed on a side of the thin film transistor facing away from the base, the organic light emitting layer comprising:
      an anode layer, formed on the side of the thin film transistor facing away from the base;
      a hole injection layer, formed on a surface of the anode layer facing away from the thin film transistor;
      a hole transport layer, formed on a surface of the hole injection layer facing away from the anode layer;
      an organic material layer, formed on a surface of the hole transport layer facing away from the hole injection layer;
      an electron transport layer, formed on a surface of the organic material layer facing away from the hole transport layer;
      an electron injection layer, formed on a surface of the electron transport layer facing away from the organic material layer; and
      a cathode layer, formed on a surface of the electron injection layer facing away from the electron transport layer;
   a touch electrode layer, formed between two adjacent layers in the organic light emitting layer;
   a passivation layer, provided between the organic light emitting layer and the thin film transistor; and
   an insulating layer, formed between the touch electrode layer and a layer of the organic light emitting layer that is adjacent to the touch electrode layer,
wherein the organic light emitting layer is electrically connected to the thin film transistor through at least one via defined in the passivation layer, and
wherein the touch electrode layer is formed:
between the anode layer and the hole injection layer, or
between the hole transport layer and the organic material layer, or
between the organic material layer and the electron transport layer, or
between the electron injection layer and the cathode layer.

* * * * *